United States Patent [19]

Sawada

[11] Patent Number: 5,893,925

[45] Date of Patent: Apr. 13, 1999

[54] SYNCHRONOUS SEMICONDUCTOR MEMORY DEVICE IN WHICH BURST COUNTER IS COMMONLY EMPLOYED FOR DATA WRITING AND FOR DATA READING

[76] Inventor: Seiji Sawada, Hyogo, Japan

[21] Appl. No.: 08/767,775

[22] Filed: Dec. 17, 1996

[30] Foreign Application Priority Data

Dec. 25, 1995 [JP] Japan .................................. 7-336784

[51] Int. Cl.$^6$ .................................................. G06F 12/00
[52] U.S. Cl. ...................... 711/167; 365/236; 365/189.05
[58] Field of Search .............................. 365/233, 236, 365/189.05, 194, 230.08; 711/167

[56] References Cited

U.S. PATENT DOCUMENTS

| | | | |
|---|---|---|---|
| 5,269,015 | 12/1993 | Shires | 711/211 |
| 5,386,385 | 1/1995 | Stephens | 365/189.05 |
| 5,566,108 | 10/1996 | Kitamura | 365/233 |
| 5,568,445 | 10/1996 | Park | 365/233 |

OTHER PUBLICATIONS

DRAM 1993 Data Book, from Micron Semiconductor, Inc. Author unknown, pp. 2–1, 2–2, and 2–3, Mar. 1993.

Primary Examiner—Tod R. Swann
Assistant Examiner—Christopher S. Chow

[57] ABSTRACT

A read control flip-flop circuit is activated upon activation of an internal readout instruction signal from a command decoder to generate a signal for activating an internal data reading circuit. A write control flip-flop circuit activates an internal data writing circuit in response to an internal write operation instruction signal from the command decoder. When one of the internal write instruction signal and the internal readout instruction signal from this command decoder is activated, a burst length counter counts a predetermined number of clock cycles, and when the counted value reaches a predetermined value, a reset signal is activated to reset the read control flip-flop circuit and the write control flip-flop circuit. Thus, the layout area of the control portion for internal data read operation and internal data write operation in a synchronous semiconductor memory device is reduced.

7 Claims, 9 Drawing Sheets

FIG.7A
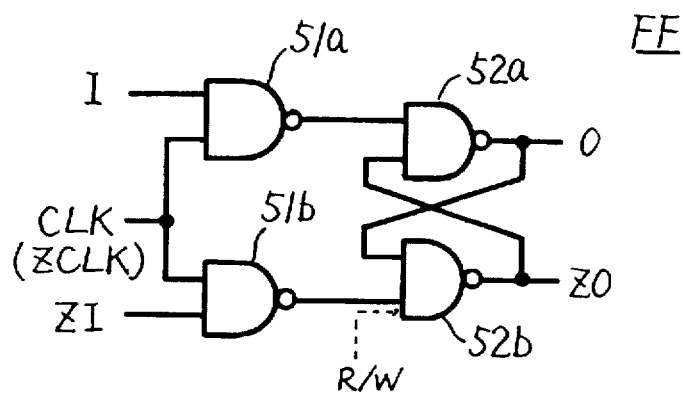
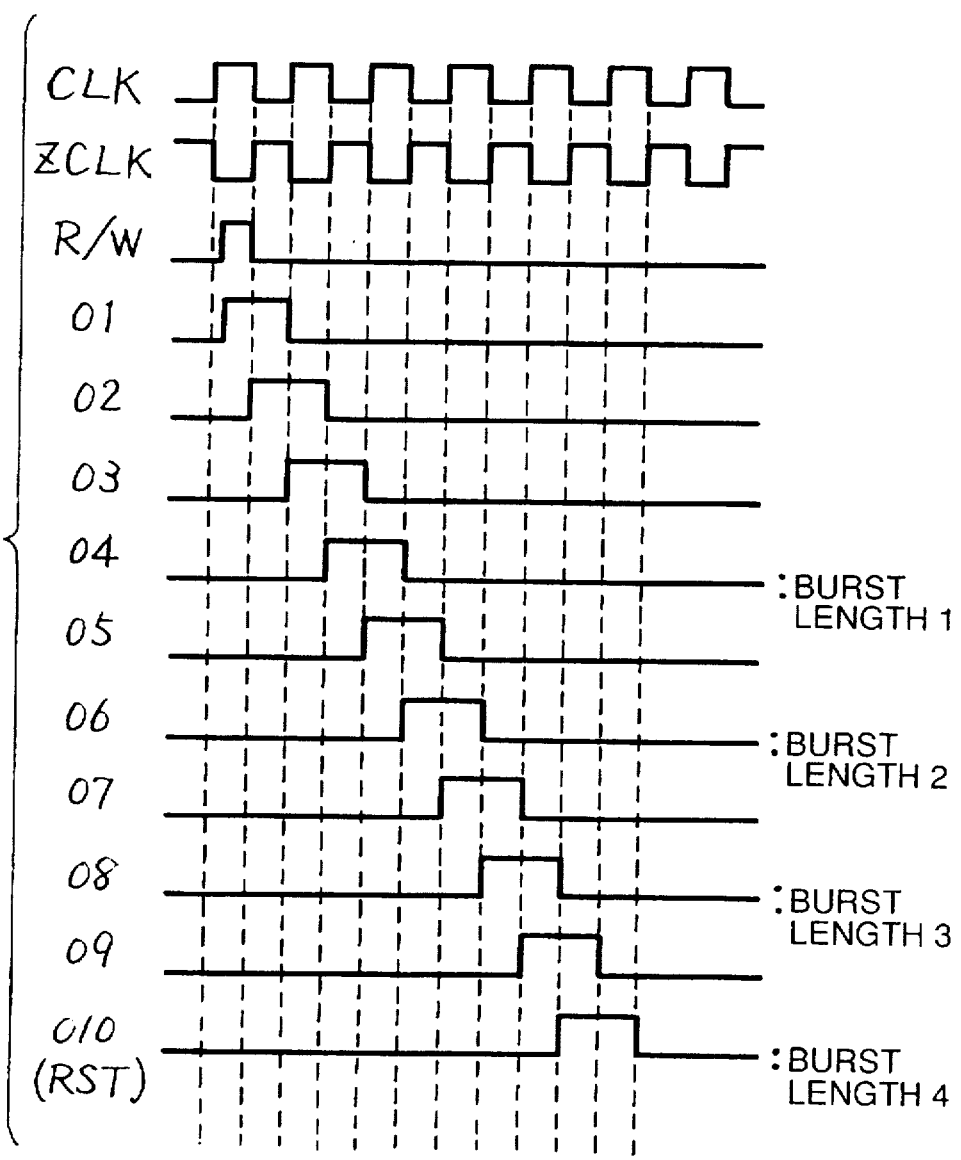
FIG.7B

SYNCHRONOUS SEMICONDUCTOR MEMORY DEVICE IN WHICH BURST COUNTER IS COMMONLY EMPLOYED FOR DATA WRITING AND FOR DATA READING

BACKGROUND OF THE INVENTION

1. Field of the Invention

The present invention relates to a synchronous semiconductor memory device, and particularly to a structure of a portion of a synchronous semiconductor memory device for controlling input/output operation of internal data.

2. Description of the Background Art

FIG. 10 schematically shows an entire structure of a conventional synchronous semiconductor memory device. Referring to FIG. 10, the synchronous semiconductor memory device includes a memory array 1 having a plurality of dynamic type memory cells arranged in rows and columns. Although the structure of the memory cells included in this memory array 1 is not shown, generally 1 transistor/1 capacitor type memory cells are employed.

The synchronous semiconductor memory device further includes an input buffer circuit 2 which incorporates externally applied control signals, that is, a row address strobe signal ZRAS, a column address strobe signal ZCAS, and write enable signal ZWE in synchronization with externally and repeatedly applied clock signals CLK to generate an internal control signal, a command decoder 4 which determines the states of the internal control signals applied from the input buffer circuit 2 to generate a signal for activating a designated internal operation, a readout control circuit 6 activated in response to readout operation instruction signal R from command decoder 4 to generate a readout operation activation signal READ for activating an operation of reading out data of a selected memory cell of memory array 1, and a write control circuit 8 activated in response to a write instruction signal W applied from command decoder 4 to generate a write operation activation signal WRITE for activating an operation of writing data to a selected memory cell of memory array 1.

Input buffer circuit 2 incorporates externally applied control signals ZRAS, ZCAS and ZWE in synchronization with the rise of clock signal CLK and generates internal control signals each in the form of a one-shot pulse signal according to the state of these external control signals. Command decoder 4 decodes this internal control signals applied from input buffer circuit 2 in the form of one-shot pulse to determine the designated internal operation. In other words, in the synchronous semiconductor memory device, the operation to be executed within this device is designated by the combination of the states of the external control signals at the time of rise of clock signal CLK. Here, clock signal CLK may either be an externally applied clock signal or an internal clock signal obtained by buffering this externally applied clock signal.

The synchronous semiconductor memory device further includes an address buffer 18 which incorporates an externally applied address signal AD in synchronization with clock signal CLK to generate an internal address signal, a cell selecting circuit 20 activated in response to a cell selecting operation activation signal from command decoder 4 to select a corresponding memory cell in memory array 1 in accordance with the internal address signal applied from address buffer 18, a write circuit 10 activated in response to write operation activation signal WRITE from write control circuit 8 to write an internal write data applied from input buffer circuit 14 successively to a selected memory cell of memory array 1, and a readout circuit 12 activated in response to readout operation activation signal READ from readout control circuit 6 to successively read out data of a selected memory cell of memory array 1 and to apply the data to output buffer circuit 16.

Normally, write circuit 10 and readout circuit 12 respectively have a plurality of registers and conduct the data stored in these registers in synchronization with the clock signal. There are various data transfer sequences for these write circuit 10 and readout circuit 12, but in this specification, description is simply made that when activated write circuit 10 and readout circuit 12 perform data writing or data reading with a predetermined sequence in synchronization with clock signal CLK.

Input buffer circuit 14 operates in synchronization with clock signal CLK and incorporates external write data DQ (D) applied to data input/output terminal 21 for application to write circuit 10. Output buffer circuit 16 is activated in response to data output enable signal OEM applied from output control circuit 22, buffers the internal readout data applied from readout circuit 12 in synchronization with the clock signal and conducts this buffered data to data input/output terminal 21.

Output control circuit 22 delays readout operation activation signal READ applied from readout control circuit 6 for a prescribed time period (CAS latency) to produce data output enable signal OEM. CAS latency indicates the number of cycles of clock signal CLK required after application of a read command (that is, set of states by which data readout operation is designated by external control signals ZRAS, ZCAS and ZWE) until appearance of valid data DQ(Q) at data input/output terminal 21. More specifically, valid data appears at input/output terminal 21 upon expiration of CAS latency after the application of the read command.

In this synchronous semiconductor memory device, externally applied control signals ZRAS, ZCAS and ZWE are incorporated in synchronization with external clock signal CLK applied periodically and repeatedly to designate this internal operation. Address signal AD is also incorporated in synchronization with clock signal CLK. Internal operation timing is determined by the clock signal, and data input and data output are also performed in synchronization with clock signal CLK. Accordingly, there is no need to take into consideration the timing margin for skew of external control signals ZRAS, ZCAS and ZWE as well as address signal AD (since the defined timings of these signals are determined at the time of the rise of clock signal CLK), so that the internal operation can be started in a faster timing. In addition, since data are also input and output in synchronization with clock signal CLK, data can be input and output in a faster speed.

FIG. 11 is a diagram showing an example of a structure of readout control circuit 6 in FIG. 10. Referring to FIG. 11, readout control circuit 6 includes a burst length counter 6a activated in response to internal readout operation instruction signal R applied from command decoder 4 shown in FIG. 10 to count clock signals CLK to a predetermined number (i.e., burst length), and a flip-flop 6b set in response to activation of internal readout operation instruction signal R and reset in response to reset signal RST (R) which is a count-up signal from burst length counter 6a. Readout operation activation signal READ is output from this flip-flop 6b. The burst length counted at burst length counter 6a indicates the number of data which can be read out successively upon data reading when a read command is applied thereto once.

Flip-flop 6b includes an inverter 6ba receiving readout operation instruction signal R, an inverter 6bb receiving write operation instruction signal W, an NAND circuit 6bc receiving an output signal of inverter 6ba at its one input, and an NAND circuit 6bd receiving an output signal of NAND circuit 6bc, an output signal of inverter 6bb and reset signal RST(R) applied from burst length counter 6a through an inverter 6be. An output signal of NAND circuit 6bd is applied to the other input of NAND circuit 6bc.

The write operation instruction signal W is generated (that is, activated) from command decoder 4 upon the rise of clock signal CLK when external control signals ZRAS, ZCAS and ZWE are set at predetermined states and data write operation is designated. Readout operation activation signal READ is output from NAND circuit 6bc. This readout control circuit 6 is set when readout operation instruction signal R is activated and is reset when reset signal RST (R) from burst length counter 6a is activated. Accordingly, the activation period of readout operation activation signal READ is determined by the burst length counted by burst length counter 6a.

FIG. 12 shows an example of a structure of write control circuit 8 in FIG. 10. Referring to FIG. 12, write control circuit 8 includes a burst length counter 8a activated upon activation of write instruction signal W to count a burst length, and a flip-flop 8b set upon activation of write instruction signal W and reset upon activation of reset signal RST (W) from burst length counter 8a. Internal write operation activation signal WRITE is output from this flip-flop 8b.

Flip-flop 8b includes an inverter 8ba receiving write instruction signal W, an inverter 8bb receiving readout instruction signal R, an NAND circuit 8bc receiving an output signal of inverter 8ba at its one input to output write operation activation signal WRITE, and an NAND circuit 8bd receiving an output signal of NAND circuit 8bc, an output signal of inverter 8bb, and reset signal RST (W) from burst length counter 8a applied via an inverter 8be. An output signal of this NAND circuit 8bd is applied to the other input of NAND circuit 8bc.

Burst length counter 8a counts the burst length at the time when data write operation is performed. The operations of readout control circuit 6 and write control circuit 8 shown in FIGS. 11 and 12 will now be described hereinbelow, with reference to FIG. 13 which is a timing chart for these operations. Here, it is assumed that the burst length is 4 for both reading and writing operations.

In the period of clock cycle #0, active command (memory cell selecting operation start instruction signal) is already provided. Cell selecting circuit 20 is activated in the synchronous semiconductor memory device and a memory cell would be at a selected state in memory cell array 1.

In clock cycle #1, a write command is applied so as to activate write operation instruction signal W from command decoder 4 for a prescribed period. In response to this activation of write operation instruction signal W, flip-flop 8 is set and write operation activation signal WRITE is activated at H level. At this time, burst length counter 8a is also activated to start the counting operation of clock signal CLK. According to this write command, a column selecting circuit included in cell selecting circuit 20 selects a column of the memory cell. Input buffer circuit 14 incorporates an external write data DQ (D0) applied to data input/output terminal 21 and provides this data to write circuit 10. Write circuit 10 is activated in response to write operation activation signal WRITE to write the write data from this input buffer circuit 14 to a selected memory cell of memory array 1. During the period in which this write operation activation signal WRITE is in activation, write circuit 10 successively writes the write data applied from input buffer circuit 14 in synchronization with clock signal CLK to selected memory cell of memory array 1.

In clock cycle #5, reset signal RST (W) from burst length counter 8a is activated, and write operation activation signal WRITE is reset at L level. In this clock cycle #5, external write data is not applied, and thus write operation of this write circuit 10 is inhibited even when input buffer circuit 14 operates according to clock signal CLK, so as to prevent writing of undefined data. More particularly, in the data write cycle, write circuit 10 internally writes the data from input buffer circuit 14 to a selected memory cell of memory array 1 with a delay of 1 clock cycle per each data writing.

In clock cycle #7, when read command is applied, internal readout instruction signal R from command decoder 4 is activated to attain H level for a prescribed period, and in response to this activation, flip-flop 6b is set to activate readout operation activation signal READ to attain H level. In response to this activation of readout operation activation signal READ, a selecting operation for a memory cell in memory array 1 is performed, and the data of this selected memory cell is readout by readout circuit 12.

Output control circuit 22 delays this readout operation activation signal READ for a prescribed period (CAS latency, i.e., one clock cycle) and activates data output enable signal OEM to attain H level. Output buffer circuit 16 is activated in response to this activation of data output enable signal OEM and conducts the data which is successively readout from readout circuit 12 to data input/output terminal 21. Accordingly, data Q0, Q1, Q2 and Q3 are successively readout from clock cycle #9.

After burst length counter 6a has counted clock signal CLK four times, reset signal RST (R) is activated to attain H level in clock cycle #11. Thus, readout circuit 12 is inactivated. At this time, data output enable signal OEM is still in an activated state at H level, and in clock cycle #12, data Q3 is output to data input/output terminal 21 via output buffer circuit 16. After this readout of data Q3, data output enable signal OEM is inactivated in clock cycle #12.

At the time of this data readout, the period between the application of a read command and the first output of a valid data, that is, the period between clock cycle #7 to clock cycle #9, is called the CAS latency.

By the operation described above, it is made possible to input or output four data (burst length 4) successively in synchronization with clock signal CLK.

As shown in FIGS. 11 and 12, burst length counters are provided in readout control circuit 6 and write control circuit 8, respectively. Reset of flip-flop 6b is performed by internal write instruction signal W as well as by reset signal RST (R) for the following reason. If, write command is applied after the read command is applied and data write operation is started before burst length counter 6a completes counting the burst length, readout circuit 12 has to be inactivated so as to stop the data readout operation. In addition, reset of flip-flop 8b is performed by readout instruction signal R as well as by reset signal RST (W) in write control circuit 8 as shown in FIG. 12 for the following reason. After the write command is applied, if a read command is newly applied before burst length counter 8a finishes counting the burst length, this write circuit 10 has to be inactivated so as to stop the data write operation. The operation as described above in which a command designating a different access mode is provided before input or output of the burst length data is referred to as an "interruption."

In addition to such situations, there may be a difference between the burst length at the time of readout operation and the burst length at the time of write operation. To accommodate such difference, respective control circuitries for data readout operation and for data write operation are separately provided.

However, as shown in FIGS. 11 and 12, readout control circuit 6 and write control circuit 8 are provided with burst length counters 6a and 8a. These burst length counters 6a and 8a are generally formed of clock shift circuits which shift readout operation instruction signal R or write operation instruction signal W in synchronization with clock signal CLK, occupying a relatively large area. Accordingly, when burst length counters 6a and 8a are respectively provided to readout control circuit 6 and write control circuit 8, the area occupied by the portion for controlling the data input/output operation would be made large, which is a significant disadvantage for the implementation of a highly integrated synchronous semiconductor memory device which occupies only a small area.

SUMMARY OF THE INVENTION

It is an object of the present invention to provide a synchronous semiconductor memory device including a portion for controlling internal data write/read operation which occupies only a small area.

The synchronous semiconductor memory device according to the present invention includes a readout instruction signal generating means responsive to an externally applied readout instruction signal to generate an internal readout instruction signal in synchronization with a clock signal, circuitry responsive to an externally applied write instruction signal to generate an internal write instruction signal in synchronization with a clock signal, readout activating circuitry responsive to the internal readout instruction signal to activate an internal readout operation activation signal, write activating circuitry responsive to the internal write instruction signal to activate an internal write operation activation signal, and resetting circuitry coupled to receive both of these internal readout instruction signal and internal write instruction signal to be activated in response to the activation of one of the internal readout instruction signal and internal write instruction signal. The reset circuitry counts the clock signals and applying reset signals to both of readout activating circuitry and write activating circuitry so that both of readout operation activating circuitry and internal write operation activating circuitry are inactivated when the counted value reaches a predetermined value.

The synchronous semiconductor memory device further includes a logic gate for obtaining a logical sum of the internal readout instruction signal and the internal write instruction signal, a clock shift circuit for shifting an output signal from this logic gate in synchronization with a clock signal, circuitry for coupling an output node of the clock shift circuit corresponding to a first predetermined value to a reset output terminal in response to activation of the internal readout operation instruction signal, and circuitry for coupling an output node of the clock shift circuit corresponding to a second predetermined value to the reset output terminal in response to activation of the internal readout instruction signal.

A signal for resetting the internal readout operation activation signal and internal write operation activation signal is output from this reset output terminal so as to be provided to the internal readout activating circuitry and internal write activating circuitry.

By providing resetting circuitry which is commonly employed for both internal readout operation and internal write operation, the number of internal components of the data write/read control portion is reduced, and accordingly, the area occupied in the circuitry is reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7A shows a structure of a flip-flop circuit in FIG. 6.

FIG. 7B is a timing chart for illustrating the operation of the burst length counter in FIG. 6.

DESCRIPTION OF THE PREFERRED EMBODIMENTS

Embodiment 1

Figure 1:
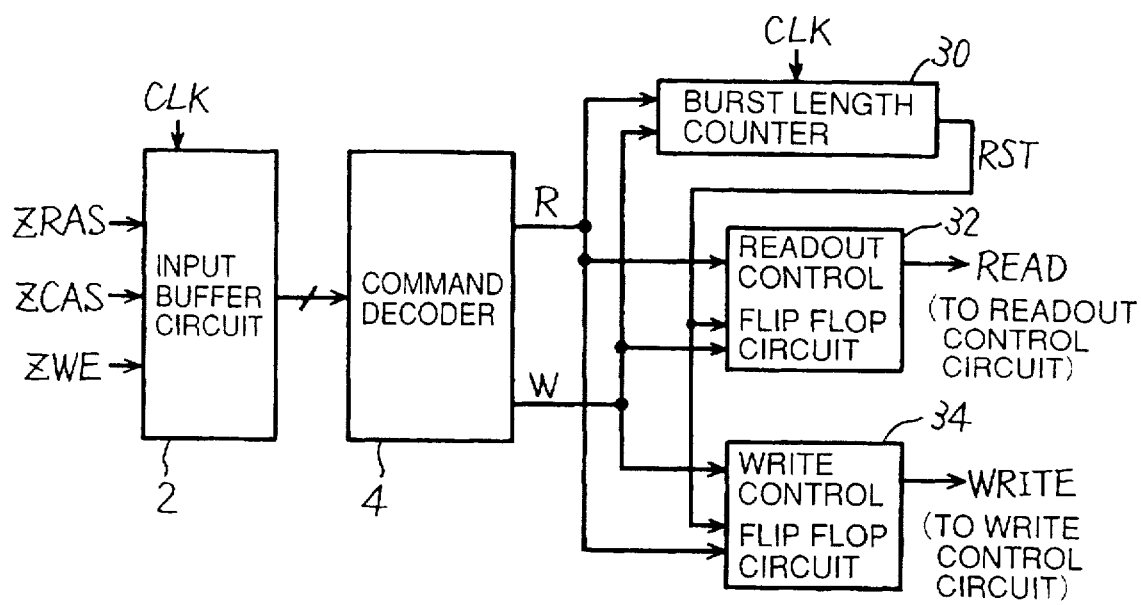
FIG. 1 shows a structure of a principal portion of a synchronous semiconductor memory device according to Embodiment 1 of the present invention.
Figure 10:
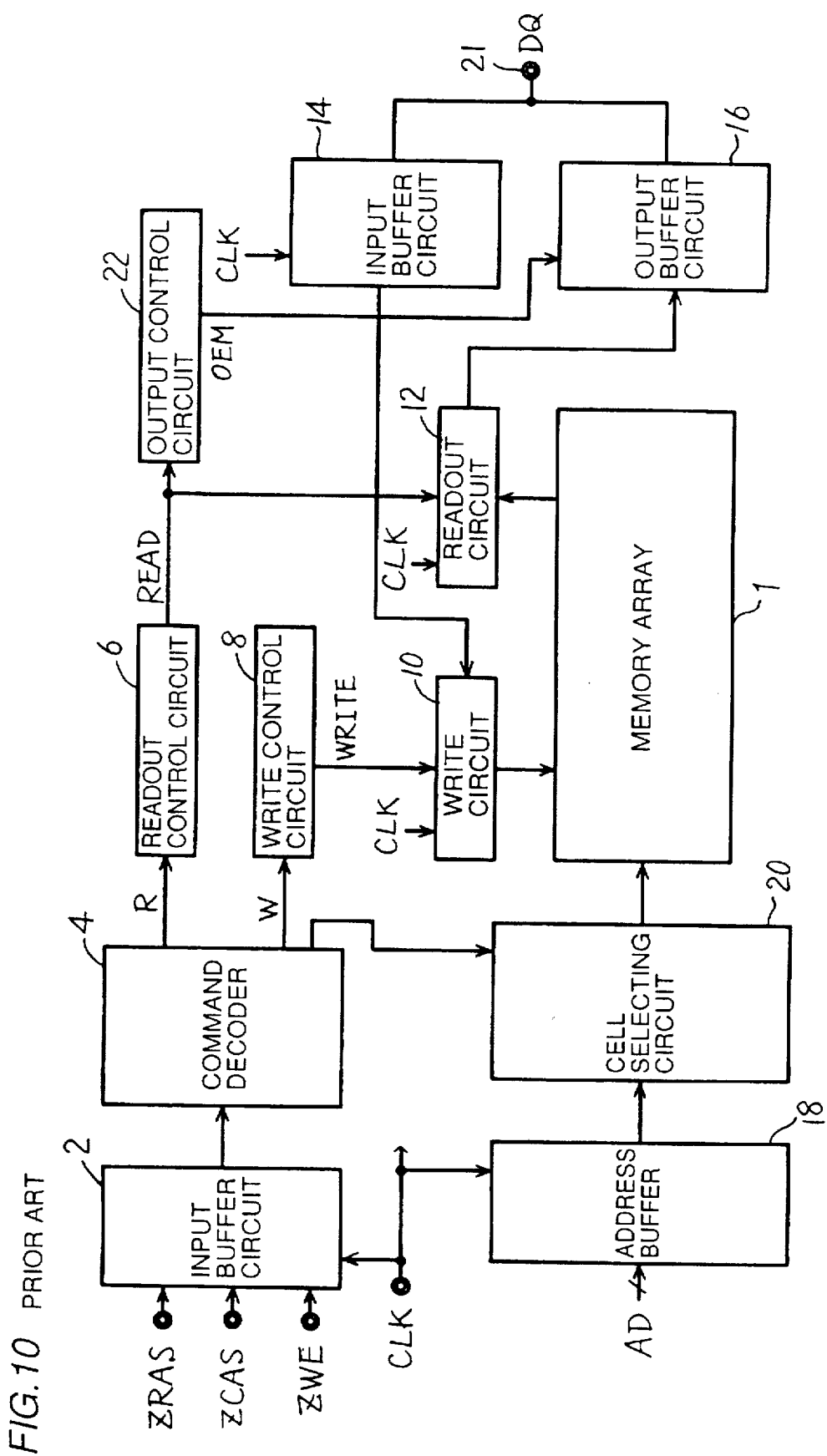
FIG. 10 is a schematic diagram showing an entire structure of a conventional synchronous semiconductor memory device.
Figure 11:
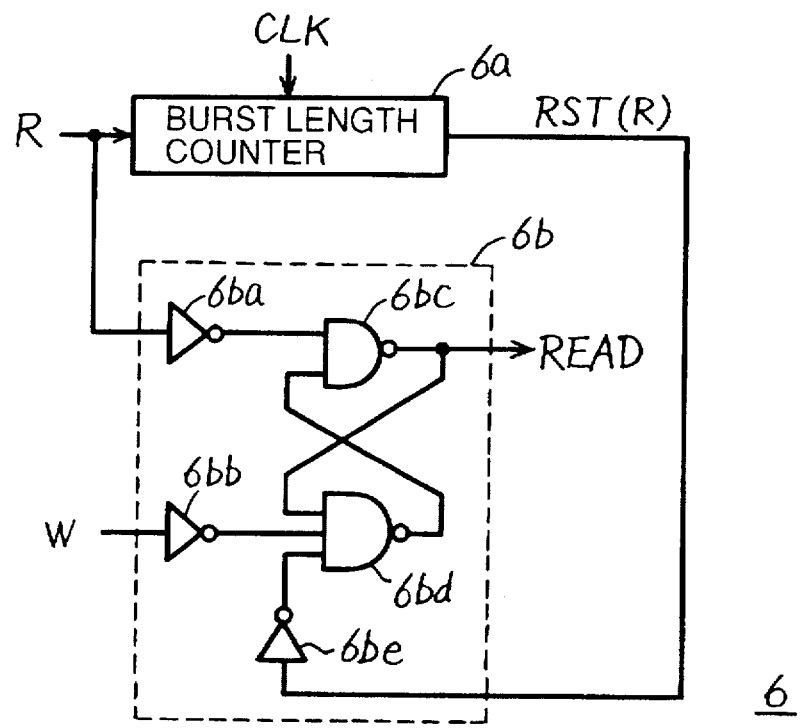
FIG. 11 shows a structure of a readout control circuit in FIG. 10.
Figure 12:
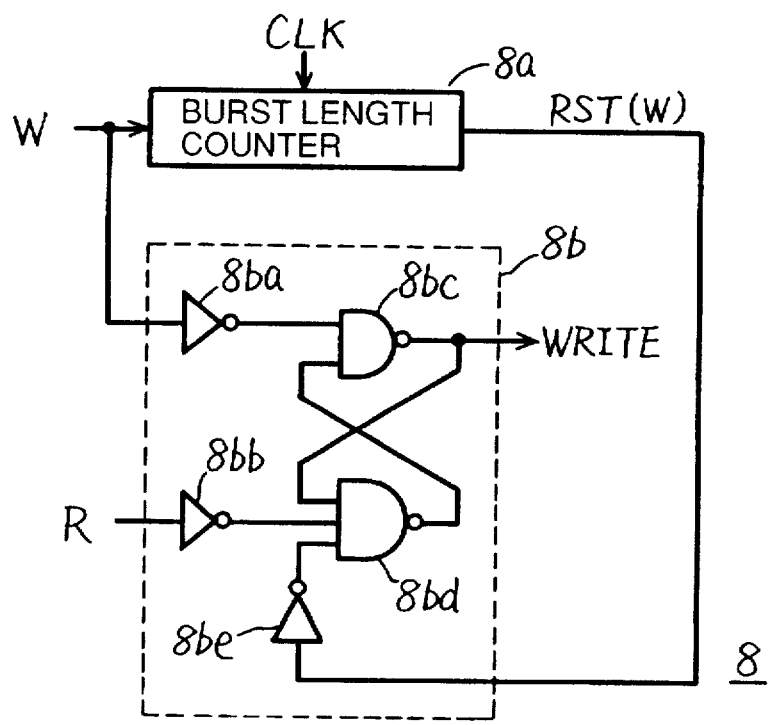
FIG. 12 shows a structure of a write control circuit in FIG. 10.
Figure 13:
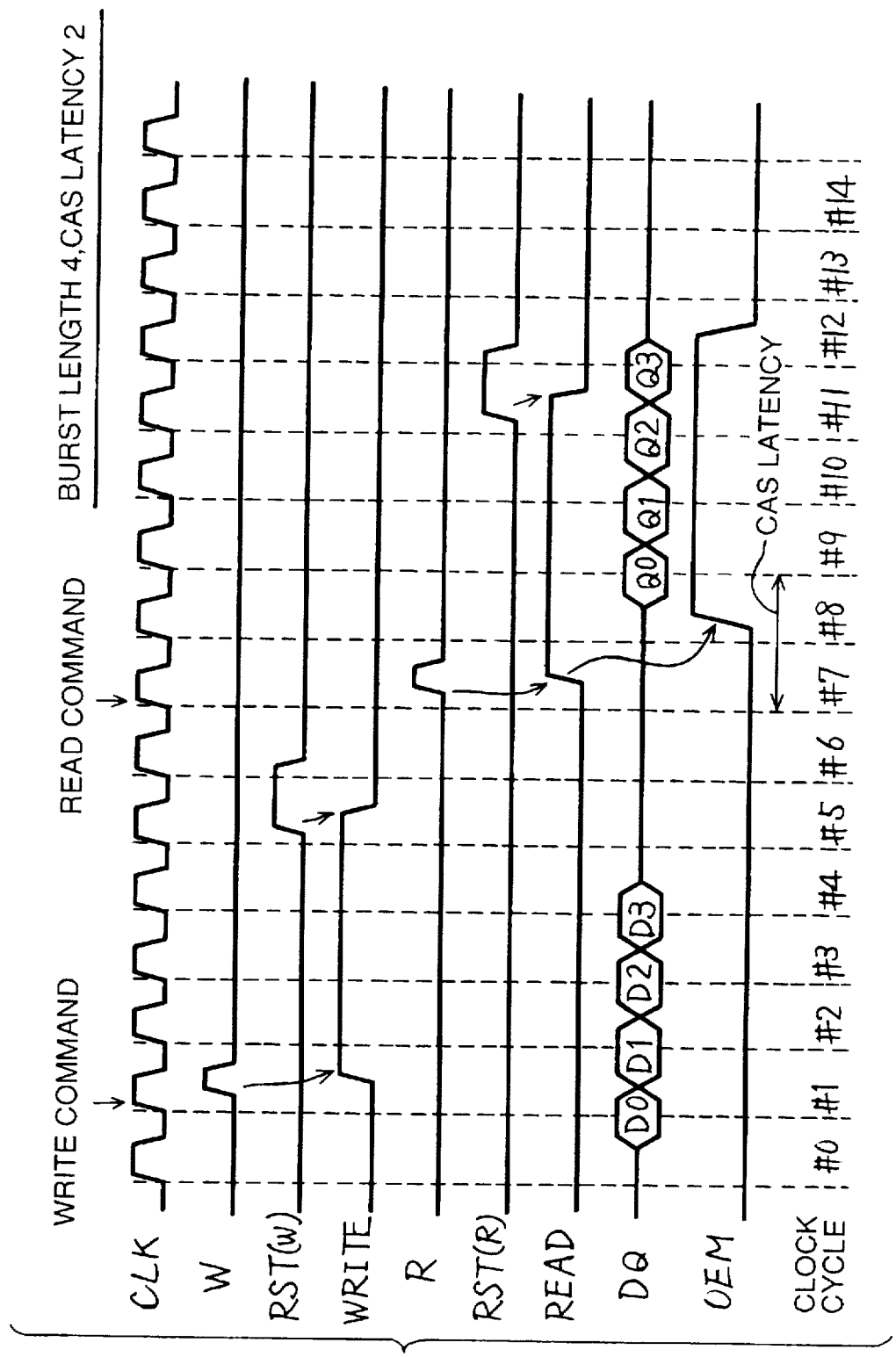
FIG. 13 is a timing chart for illustrating the operation of the synchronous semiconductor memory device in FIG. 10.

FIG. 1 is a diagram showing a structure of a principal portion of a synchronous semiconductor memory device according to Embodiment 1 of the present invention. Only the structure including internal data write/read control portions is shown in FIG. 1. Other portions of the structure is similar to those of the structure shown in FIG. 10.

Referring to FIG. 1, the synchronous semiconductor memory device includes an input buffer circuit 2 for incorporating external control signals ZRAS, ZCAS and ZWE in synchronization with a clock signal CLK to generate an internal control signal, a command decoder 4 for decoding the internal control signal output from this input buffer circuit 2, a burst length counter 30 responsive to an activation of one of an internal readout instruction signal R and an internal write instruction signal W and be activated for counting clock signal CLK, a read control flip-flop circuit 32 set in response to the activation of readout operation instruction signal R from command decoder 4 and reset in response to an activation of either one of internal write instruction signal W and the reset signal RST output from burst length counter 30, and a write control flip-flop circuit 34 set in response to activation of internal write instruction signal W and reset in response to activation of reset signal RST from burst length counter 30 or internal readout operation instruction signal R from command decoder 4.

An internal readout operation activation signal READ is output from read control flip-flop circuit 32 and is applied to a readout control circuit not shown. An internal write operation activation signal WRITE is output from write control flip-flop circuit 34 and is applied to a write control circuit not shown.

By providing burst length counter 30 commonly employed for internal data read operation and internal data write operation as shown in FIG. 1, both of the internal read operation control and internal data write operation control can be performed by a single burst length counter 30, so that the area occupied can be reduced.

Figure 2:
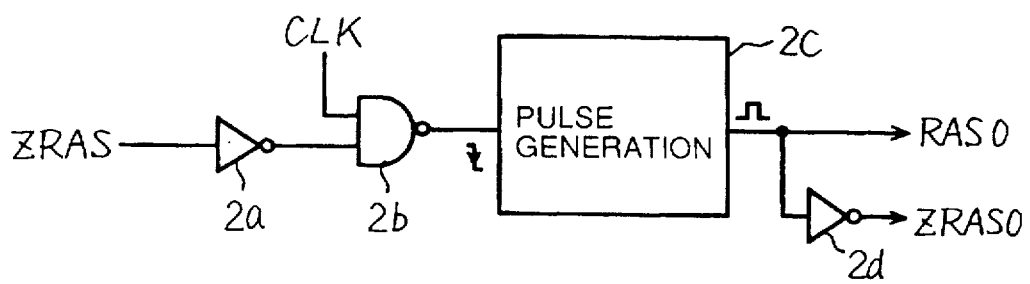
FIG. 2 shows an example of a structure of an input buffer circuit in FIG. 1.

FIG. 2 shows an example of a structure of input buffer circuit 2 in FIG. 1. In FIG. 2, the portion of the RAS buffer for receiving a row address strobe signal ZRAS which is an external control signal is shown. Buffer circuits of a structure similar to that shown in FIG. 2 are also provided for external control signals ZCAS and ZWE, respectively.

Referring to FIG. 2, the RAS buffer includes an inverter 2a receiving external control signal ZRAS, an NAND gate 2b receiving clock signal CLK and an output signal of inverter 2a, a pulse generating circuit 2c responsive to the fall of an output signal from NAND gate 2b for generating a one-shot pulse signal, and an inverter 2d receiving an output signal from pulse generating circuit 2c. An internal control signal RAS0 is output from pulse generating circuit 2c, and an internal control signal ZRAS0 is output from inverter 2d.

In the structure shown in this FIG. 2, when external row address strobe signal ZRAS is set at L level at the time of fall of clock signal CLK, the output signal of NAND gate 2b would attain L level and one-shot pulse signal at H level is output from pulse generating circuit 2c. When external row address strobe signal ZRAS is at H level at the time of rise of clock signal CLK, the output signal from NAND circuit 2b is at H level and the output signal from pulse generating circuit 2c is maintained at L level.

Accordingly, if external row address strobe signal ZRAS is at L level upon the fall of clock signal CLK, internal control signal ZRAS0 would be at H level for a prescribed time period while internal control signal ZRAS0 would be at L level for a prescribed time period. If external row address strobe signal ZRAS is at H level upon the rise of clock signal CLK, internal control signal RAS0 would be at L level while internal control signal ZRAS0 would be maintained at H level.

Figure 3A:
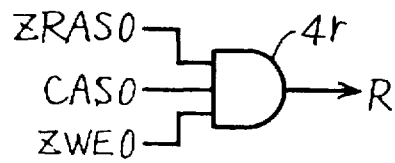
FIGS. 3A and 3B show structures of a read command decoder and a write command decoder included in a command decoder in FIG. 1, respectively.
Figure 3B:
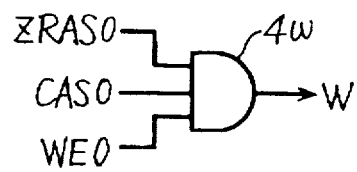

FIGS. 3A and 3B respectively show the structures of read command decode circuit and write command decode circuit included in command decoder 4 of FIG. 1. Referring to FIG. 3A, a read command decode circuit 4r is formed of an AND circuit receiving internal control signals ZRAS0, CAS0 and ZWE0 applied from input buffer 2. Internal readout instruction signal R is activated at H level when all of internal control signals ZRAS0, CAS0 and ZWE are at H level. More particularly, a read command instructing a data readout operation is applied when external control signals ZRAS and ZWE are held at H level upon the rise of clock signal CLK and external column address strobe signal ZCAS is set at L level upon the rise of clock signal CLK.

Referring to FIG. 3B, a write command decode circuit 4w is formed of an AND circuit receiving internal control signals ZRAS0, CAS0 and WE0 applied from input buffer circuit 2. Internal write instruction signal W is activated at H level when all of internal control signals ZRAS0, CAS0 and WE0 are at H level. More particularly, a write command instructing a data write operation is applied when external row address strobe signal ZRAS is set at H level and the remaining external control signals ZCAS and ZWE are both set at L level upon rise of clock signal CLK.

The read command and the write command are both applied by setting the external column address strobe signal ZCAS at L level. Accordingly, when these write and read commands are applied, a column selecting operation is performed internally. Then, writing or reading of the data for the memory cells on the selected column is executed. An active command instructing the start of selecting operation of a memory cell in a memory array is detected by an active command decode circuit not shown. In the case of this active command, external row address strobe signal ZRAS is set at L level upon the rise of clock signal CLK, and start of internal operation is instructed.

Figure 4:
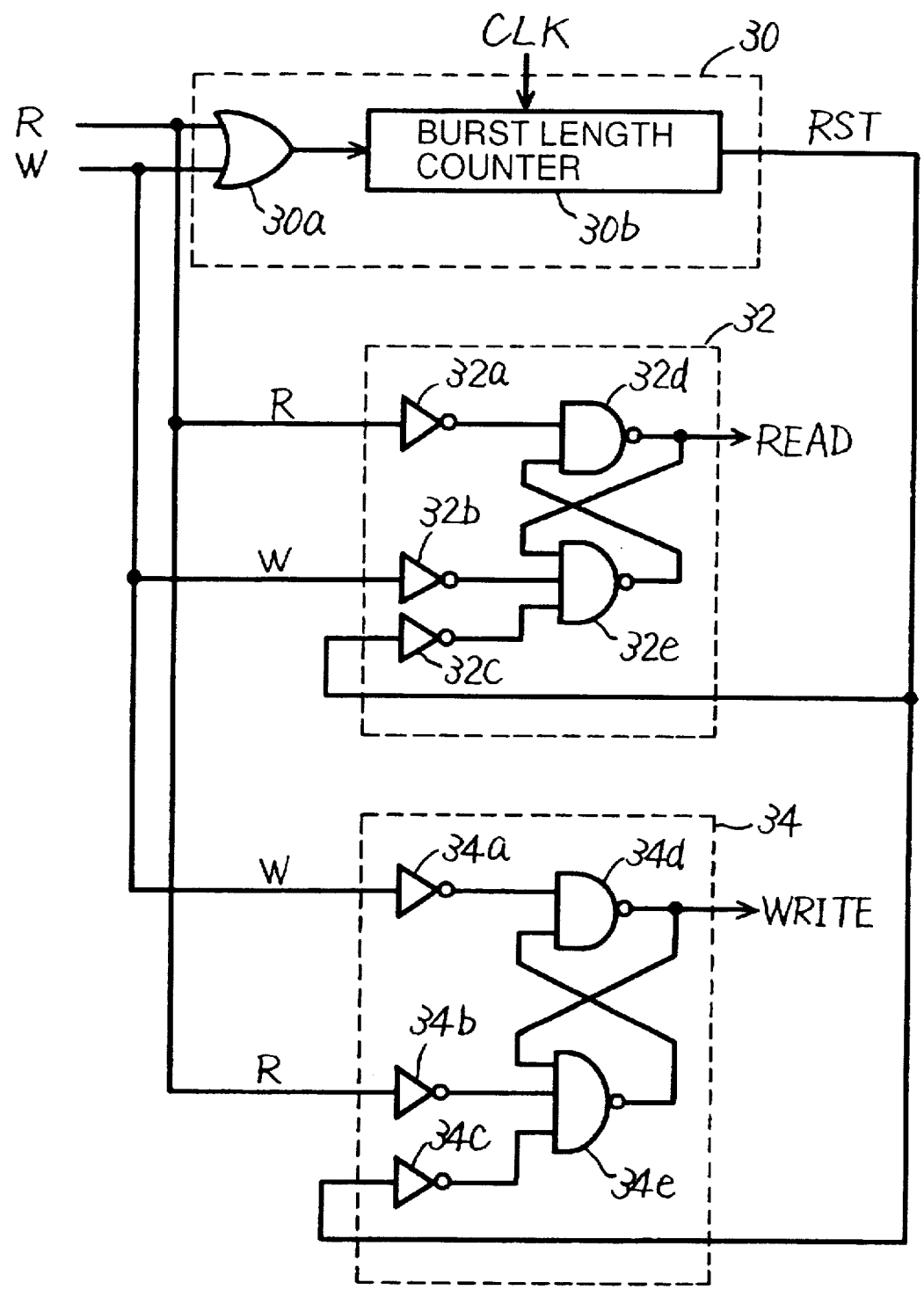
FIG. 4 shows a specific structure of a burst length counter, a read control flip-flop circuit and a write control flip-flop circuit of FIG. 1.

FIG. 4 is a diagram showing the specific structure of burst length counter 30, read control flip-flop circuit 32 and write control flip-flop circuit 34. Referring to FIG. 4, burst length counter 30 includes an OR circuit 30a receiving internal readout instruction signal R as well as internal write instruction signal W, and a burst length counter circuit 30b activated in response to activation of an output signal from OR circuit 30a to count a preset burst length.

When this burst length counter circuit 30b in activation has counted clock signal CLK a number of times determined by the burst length, reset signal RST is activated to attain H level.

Read control flip-flop circuit 32 includes an inverter 32a receiving internal readout instruction signal R, an inverter 32b receiving internal write instruction signal W, an inverter 32c receiving reset signal RST from burst length counter 30, an NAND circuit 32d receiving an output signal from inverter 32a at its one input, and an NAND circuit 32e receiving output signals from NAND circuit 32d, inverter 32b and inverter 32c.

Output signal of NAND circuit 32e is applied to the other input of NAND circuit 32d. Internal readout operation activation signal READ is output from NAND circuit 32d.

Write control flip-flop circuit 34 includes an inverter 34a receiving internal write instruction signal W, an inverter 34b receiving internal readout instruction signal R, an inverter 34c receiving reset signal RST, an NAND circuit 34d receiving an output signal from inverter 34a at its one input, and an NAND circuit 34e receiving an output signals of NAND circuit 34d, inverter 34b and inverter 34c.

Output signal of NAND circuit 34e is applied to the other input of NAND circuit 34d. Internal write operation activation signal WRITE is output from NAND circuit 34d. To provide description for the operation of the structure shown in this FIG. 4, reference will now be made to the timing chart of FIG. 5.

An active command is provided in a clock cycle before clock cycle #0 so as to activate the synchronous semiconductor memory device, and the operation of selecting a memory cell is started.

In clock cycle #1, a write command is provided, so that internal write instruction signal W from write command decoding circuit 4 shown in FIG. 3B is activated to attain H level for a prescribed time period. Thereafter, in response to this activation of internal write instruction signal W, the output signal of inverter 34a in write control flip-flop circuit 34 attains L level and internal write operation activation signal WRITE output from NAND circuit 34 is activated to attain H level (in other words, write control flip-flop circuit 34 is set).

In burst length counter 30, the output signal of OR circuit 30a attains H level in response to this activation of write instruction signal W and burst length counter circuit 30b is activated to count the clock signal CLK. Write data D0 applied to a data input buffer circuit not shown is provided to the write circuit through the data input buffer. By the write circuit which has been activated in response to this write operation activation signal WRITE, write data D0, D1, D2 and D3 successively provided during clock cycles #1 to #4 are respectively written into the selected memory cells of the memory cell array with a predetermined sequence.

As has been described, when the write command is provided, the column selecting operation of selecting a corresponding memory cell from the memory cells selected according to the active command is performed in the memory cell array in parallel with data writing operation.

When burst length counter circuit 30b has counted the burst length (which is 4 in the structure shown in FIG. 5), reset signal RST is activated to attain H level in clock cycle #5. Responsively, write control flip-flop circuit 34 is reset and internal write operation activation signal WRITE is inactivated to attain L level. More particularly, the output signal of inverter 34c attains L level, the output signal of NAND circuit 34e attains H level, and in response, the output signal WRITE of NAND circuit 34d attains L level. (At this time, the output signal of inverter 34a has already attained H level.) Internally, data is written into the selected memory cell in synchronization with the rise of clock signal CLK upon activation of write operation activation signal WRITE, and writing of write data D0 to D3 are all completed at the time of rise of clock signal CLK in clock cycle #5.

Read command is applied in clock cycle #7, and in response, internal readout instruction signal R from read command decode circuit 4r shown in FIG. 3A is activated to attain H level for a prescribed period. Thus, read control flip-flop circuit 32 is set and readout operation activation signal READ is activated to attain H level. In other words, the output signal of inverter 32a attains L level and readout operation activation signal READ output from NAND circuit 32d attains H level. In burst length counter 30, the output signal of OR circuit 30a attains H level in response to the activation of this readout instruction signal R, burst length counter circuit 30b is activated, and counting operation of clock signal CLK is started.

In response to this activation of readout operation activation signal READ, a readout circuit not shown is activated, and data from the selected memory cell is read out. Read out data Q0 to Q3 are successively output, starting from clock cycle #9 which comes after expiration of a predetermined CAS latency (which is 2 in FIG. 5).

When burst length counter circuit 30 has counted the clock signals four times which correspond to the burst length, reset signal RST is activated to attain H level in clock cycle #11 so that read control flip-flop circuit 32 is reset and readout operation activation signal READ is inactivated to attain L level. More particularly, the output signal form inverter 32c attains L level, the output signal from NAND circuit 32e attains H level, and readout operation activation signal READ output from NAND circuit 32d attains L level. Data output buffer circuit is still in activation (see FIG. 10), and in clock cycle #12, read operation is completed upon output of data Q3.

As described above, burst length counter 30 can cause accurate reading and writing of data according to internal readout instruction signal and internal write instruction signal as in the conventional example even when it is provided to be employed commonly for both internal data write operation control and internal data read operation control. Particularly, by employing burst length counter 30 commonly for both data write and data read operations, the layout area of this data read and write control portion can be reduced.

In the structure shown in FIG. 4, internal write instruction signal W is applied to read control flip-flop circuit 32 as a reset signal so as to complete the read operation when write command is provided during the data read operation. Similarly, internal readout instruction signal R is applied to write control flip-flop circuit 34 as reset signal R in order to complete the data write operation when a read command to instruct data read operation is applied before completion of burst length data writing.

It may be noted that reset signal RST from burst length counter 30 is inverted by inverters 32c and 34c respectively to be provided to read control flip-flop circuit 32 and write control flip-flop circuit 34 in the structure shown in FIG. 4. This is done so as to reduce the output drive capability of the burst length counter 30 to reduce the output load. After this reset signal RST from burst length counter 30 is inverted, however, the inverted reset signal may be applied to the reset inputs of read control flip-flop 32 and write control flip-flop 34.

Thus, in accordance with Embodiment 1 of the present invention, since the burst length counter is employed commonly for both data read operation and data write operation, it is made possible to reduce the layout area of internal data write/read control portion.

Embodiment 2

Figure 6:
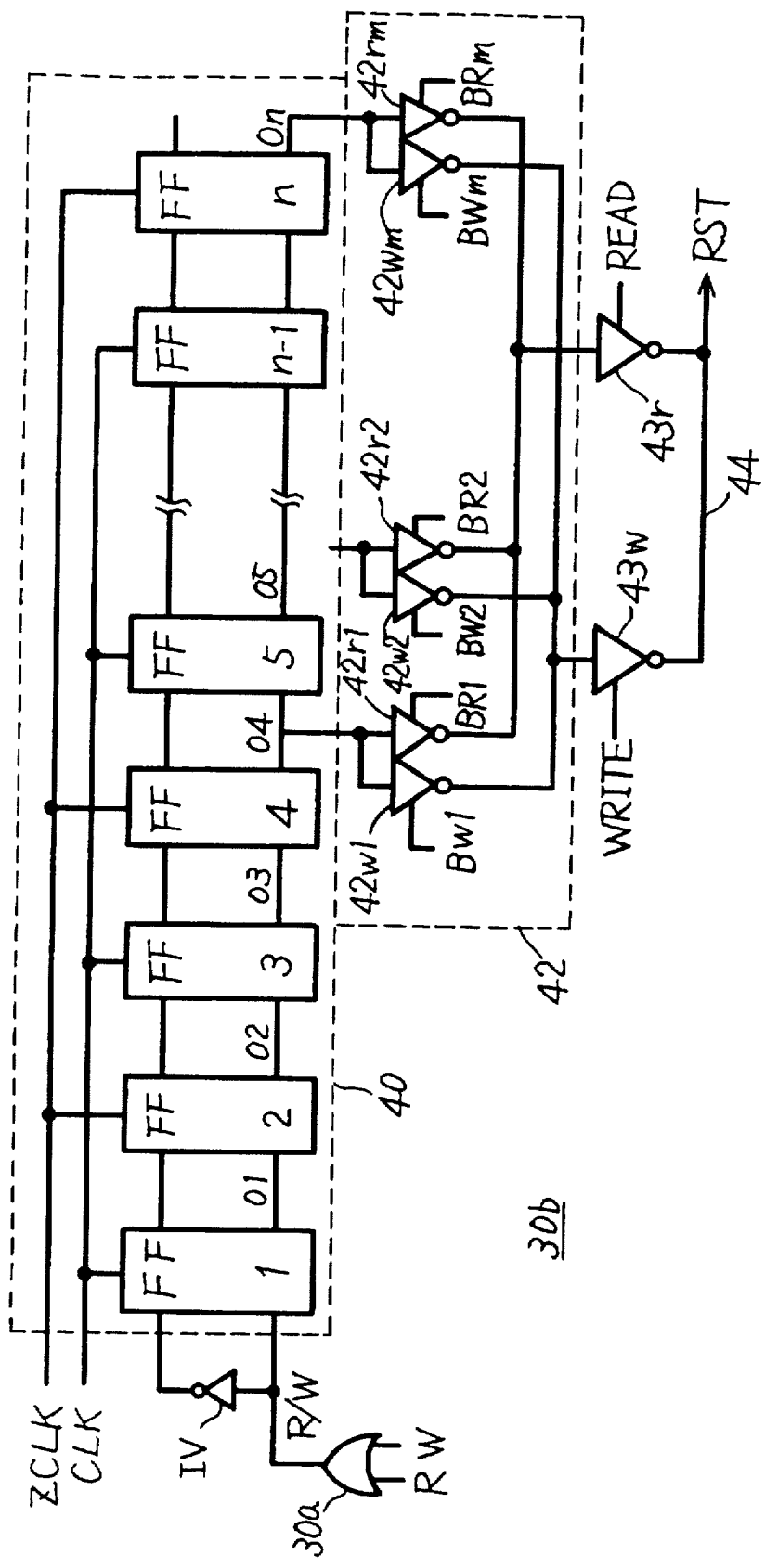
FIG. 6 shows an example of a specific structure of the burst length counter in FIG. 4.

FIG. 6 shows a structure of a principal portion of a synchronous semiconductor memory device according to Embodiment 2 of the present invention. In FIG. 6, the structure of a burst length counter 30 is shown.

Referring to FIG. 6, a burst length counter circuit 30b includes an inverter IV for inverting an output signal R/W from an OR circuit 30a, a clock shift circuit 40 for successively transferring output signal R/W of OR circuit 30a and an output signal of inverter IV according to clock signals CLK and ZCLK, an output selecting circuit 42 for selecting an output of this clock shift circuit 40 according to burst length setting data BR for data reading and burst length setting data BW for data writing, a 3-state inverter buffer 43w activated upon activation of write operation activation signal WRITE for inverting the signal selected by output selecting circuit 42 to produce a reset signal RST, and a 3-state inverter buffer 43r activated upon activation of readout operation activation signal READ for inverting the signal applied from output selecting circuit 42 to output reset signal RST.

The output portions of 3-state inverter buffers 43w and 43r are coupled to a signal line 44. This signal line 44 is coupled to the reset input of read control flip-flop circuit 32 and write control flip-flop circuit 34 shown previously in Embodiment 1.

Clock shift circuit 40 includes n flip-flops FF1 to FFn which are cascaded. Flip-flops FF1, FF3, . . . FFn-1 of odd-numbered stages transfer the applied data in synchronization with clock signal CLK. Flip-flops FF2, FF4, . . . FFn of even numbered stages transfer the applied signal in accordance with clock signal ZCLK. Two adjacent flip-flops (e.g., FF1 and FF2) implements a delay of one clock cycle.

Output selecting circuit 42 includes 3-state inverter buffers 42w1, 42w2, . . . 42wm provided at the output portions of the flip-flops of even-numbered stages counted from flip-flop FF4 which are activated in response write burst length setting signals BW1, BW2, . . . BWm to output an inversion of a signal on the corresponding output node when activated, and 3-state inverter buffers 42r1, 42r2, . . . 42rm coupled to the output portions of the flip-flops of even-numbered stages counted from flip-flop FF4 which are activated upon activation of read burst length setting signals BR1, BR2, . . . BRm to output an inversion of a signal on the output node of the corresponding flip-flop.

The output portions of 3-state inverter buffers 42w1 to 42wm are commonly connected to the input portion of 3-state inverter buffer 43w. The output portions of 3-state inverter buffers 42r1 to 42rm are commonly coupled to the input portion of 3-state inverter buffer 43r.

Upon operation, one of these write burst length setting signals BW1 to BWm are activated, one of these read burst length setting signals BR1 to BRm is activated, and reading burst data and writing burst data can be set separately. The following is a brief description on the operation.

For the sake of simplification, it is assumed that write burst length setting circuit BW1 and read burst length setting circuit BRm are activated. When a write command is provided and write operation instruction signal W is activated to attain H level, output signal R/W from OR circuit 30a attains H level. Flip-flop FF1 operates in synchronization with clock signal CLK, so as to incorporate, latch and output this signal applied from OR circuit 30a. Clock signal ZCLK is at L level and flip-flop FF2 is in a latching state holding the previous state.

When clock signal CLK falls to L level and clock signal ZCLK rises to H level, flip-flop FF2 incorporates, latches and outputs the output signal of flip-flop FF1. At this time, flip-flop FF3 has clock signal CLK at L level, is in a latching state, and is holding the previous state. Accordingly, when clock signal CLK rises twice, the output signal O4 of flip-flop FF4 attains H level. Burst length setting signal BW1 is already activated to attain H level, and 3-state inverter buffer 42w1 outputs an inversion of the signal from this flip-flop FF4.

Internal write operation activation signal WRITE is activated in response to the activation of write instruction signal W, and this 3-state inverter buffer 43w is activated to invert the signal provided from 3-state inverter buffer 42w1 and to activate reset signal RST on signal line 44, and the reset signal RST attains H level. In response to this activation of reset signal RST, internal write operation activation signal WRITE is reset and 3-state inverter buffer 43w returns to high impedance state.

When data reading operation is performed, readout operation instruction signal R is activated. In response, signal R/W is activated, and this signal is successively transferred according to clock signals CLK and ZCLK through flip-flops FF1 to FFn-1. When an output signal On from flip-flop FFn attains H level, 3-state inverter buffer 42rm activated by signal BRm inverts and outputs this output signal On from flip-flop FFn. Upon data reading, internal readout operation activation signal READ is activated, and 3-state inverter buffer 43r inverts and outputs a signal applied from this 3-state inverter buffer 42rm. Thus, reset signal RST is activated.

By the above-described structure, burst length for data reading and burst length for data writing can be set differently, even when a burst length counter is commonly employed.

In the structure shown in this FIG. 6, output signal R/W of OR circuit 30a is successively transferred through flip-flops FF1 to FFn. When write operation and read operation are performed in continuation or when there occurs an interruption, this signal R/W may also be applied to flip-flops FF2 to FFn for their resetting in order to count the burst length accurately. In this way, each of the flip-flops FF2 to FFn can be reset to accurately conduct a newly provided signal R/W in accordance with clock signals CLK and ZCLK such that erroneous operation can be prevented. Here in this description, flip-flop FF1 of the first stage is not reset in order to prevent the resetting of the newly applied signal R/W, but resetting may also be effected at flip-flop FF1 of the first stage.

FIG. 7A shows an example of a structure of flip-flops FF1 to FFn shown in FIG. 6. Each of flip-flops FF1 to FFn has an identical structure, and one flip-flop FF is shown in FIG. 7A as representative.

Referring to FIG. 7A, flip-flop FF includes an NAND circuit 51a receiving an input signal I and clock signal CLK (or ZCLK), an NAND circuit 51b receiving an input signal ZI and clock signal CLK (or ZCLK), an NAND circuit 52a receiving an output signal of NAND circuit 51a at its one input, and an NAND circuit 52b receiving an output signal of NAND circuit 51b at its one input. An output O of NAND circuit 52a is applied to the other input of NAND circuit 52b, while an output signal ZO of NAND circuit 52b is applied to the other input of NAND circuit 52b. The operation of the flip-flop shown in this FIG. 7A will be described in the following with reference to the timing chart of FIG. 7B. In FIG. 7B, flip-flops FF1 to FF10 of ten stages are employed as an example, to show the manner of changes in the respective output signals O1 to O10.

In clock cycle 0, signal R/W attains H level. At this time, clock signal CLK is at H level, and NAND circuits 51a and 51b each act as an inverter, and input signal I (R/W) is incorporated and latched. Accordingly, output signal O1 at this state rises to H level. When clock signal CLK falls to L level, output signals of NAND circuits 51a and 51b both attain H level while output signals O and ZO of NAND circuits 52a and 52b are unchanged. Meanwhile, in flip-flop FF2 of the second stage, clock signal ZCLK is at H level, and those NAND circuits 51a and 51b act as an inverter to incorporate and latch the signal applied from flip-flop FF1 of the first stage. Thereafter, this operation is repeated, the odd-numbered flip-flop incorporating and latching the applied signal when clock signal CLK is at H level and the even-numbered flip-flop incorporating, latching and outputting the applied signal when clock signal ZCLK is at H level. Accordingly, when the burst length is set at 1, an output signal O4 is selected. In synchronization with the fall of clock signal CLK in clock cycle 1, this output signal O4 attains H level and internal write/read operation in clock cycle 2 is inhibited. When the burst length is set at 2, an output signal O6 is selected, and internal write/read operation in clock cycle 3 is inhibited (that is, reset signal RST is activated in synchronization with the fall of clock signal CLK in clock cycle 2).

Figure 5:
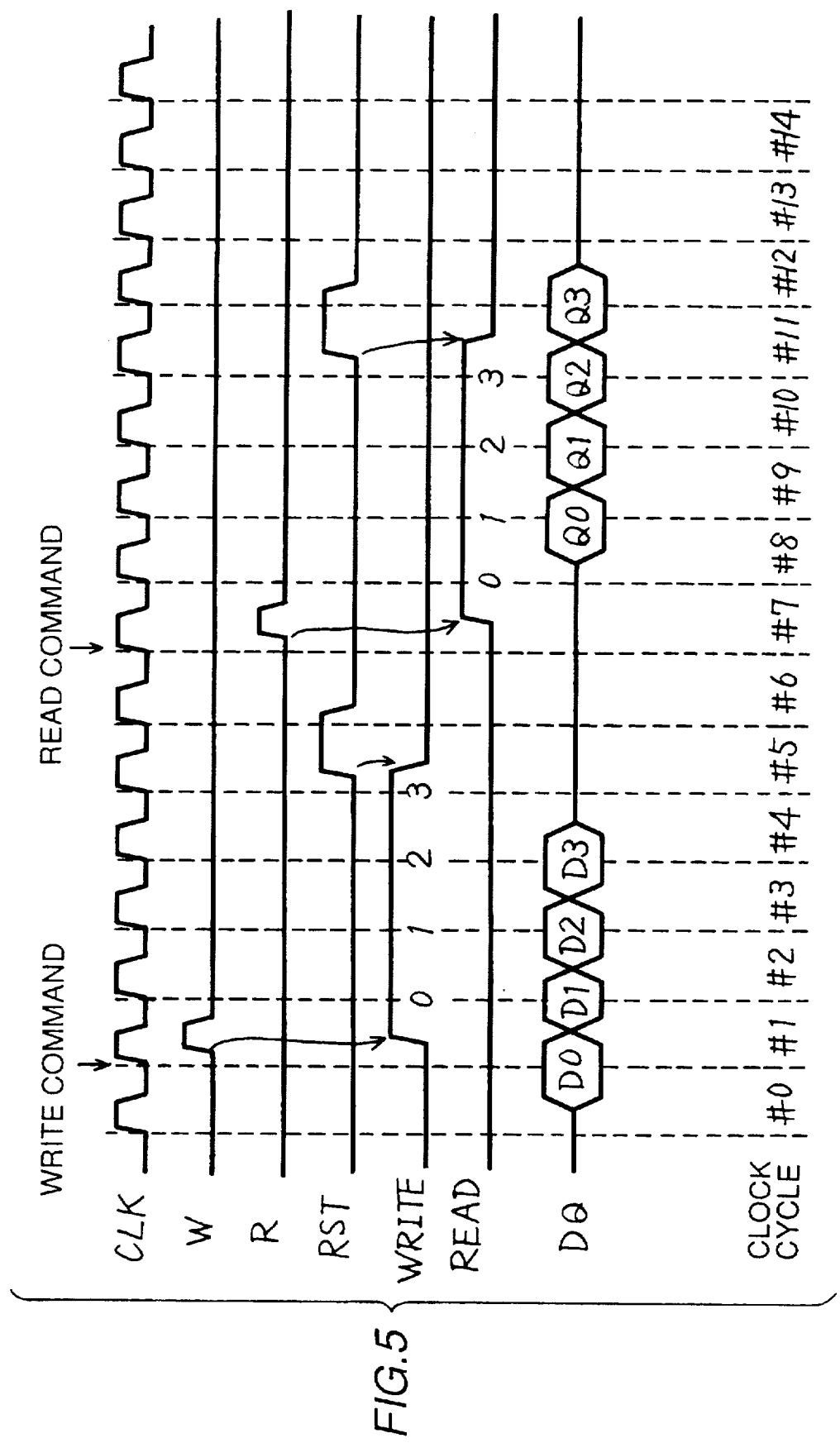
FIG. 5 is a timing chart for illustrating the operation of the structure shown in FIG. 4.

Similarly, when the burst length is set at 4, an output signal O10 of flip-flop FF1 is selected. In synchronization with the fall of clock signal CLK in clock cycle 4, this signal O10 rises to H level and thus reset signal RST is activated to attain H level upon expiration of four clock cycles after application of a read/write command, as shown in FIG. 5.

Here, if output signal R/W of OR circuit 30a is applied to NAND circuit 52b as shown by the broken line in FIG. 7A, it is ensured that burst length counter 30 upon starting the counting operation is internally reset to an initialized state before starting the counting operation.

Figure 8:
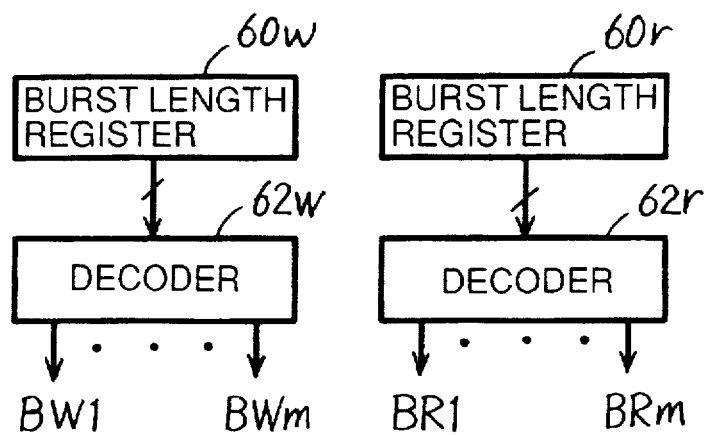
FIG. 8 shows a structure of the burst length selecting signal generating portion in FIG. 6.

FIG. 8 shows a structure of a burst length selecting signal generating portion. Referring to FIG. 8, a burst length register 60w for storing writing burst length data, a decoder 62w for decoding the stored data of this burst length register 60w to activate one of burst length selecting signals BW1 to BWm, a burst length register 60r for storing reading burst length data, and a decoder 62r for decoding the data stored in this burst length register 60r to activate one of reading burst length selecting signals BR1 to BRm are provided.

Burst length registers 60w and 60r have their storage data externally set in, for example, a special mode of the synchronous semiconductor memory device (e.g., at the time of initialization). Decoders 62w and 62r respectively decode the data stored in the corresponding ones of burst length registers 60w and 60r. As the structures of these decoders 62w and 62r, those structure of decoders shown in above-mentioned FIGS. 3A and 3B can be employed, for example. In accordance with this structure shown in FIG. 8, an optimal burst length data can be set according to the usage to which this synchronous semiconductor memory device is applied, by storing externally applied data in burst length registers 60w and 60r.

In the structure of the burst length counter in this Embodiment 2, when reset signal RST is activated and both of data write operation activation signal WRITE and data readout operation activation signal READ are inactivated, signal line 44 would be at a floating state. In order to prevent this floating state, a structure may be utilized in which signal line 44 is precharged to a ground potential or power supply potential by the output signal of NOR gate receiving write operation activation signal WRITE and readout operation activation signal READ. In this way, an unstable floating state of signal line 44 is prevented.

As has been described above, in accordance with Embodiment 2 of the present invention, such a structure is provided that setting of the burst length of the burst length counter can be performed independently for respective burst lengths for reading data and writing data so that different burst length data can be set for read and write operations, respectively, by one burst length counter. Thus, an effect similar to the effect obtained in the case in which respective burst length counters are separately provided for data reading and for data writing can be implemented.

Embodiment 3

Figure 9:
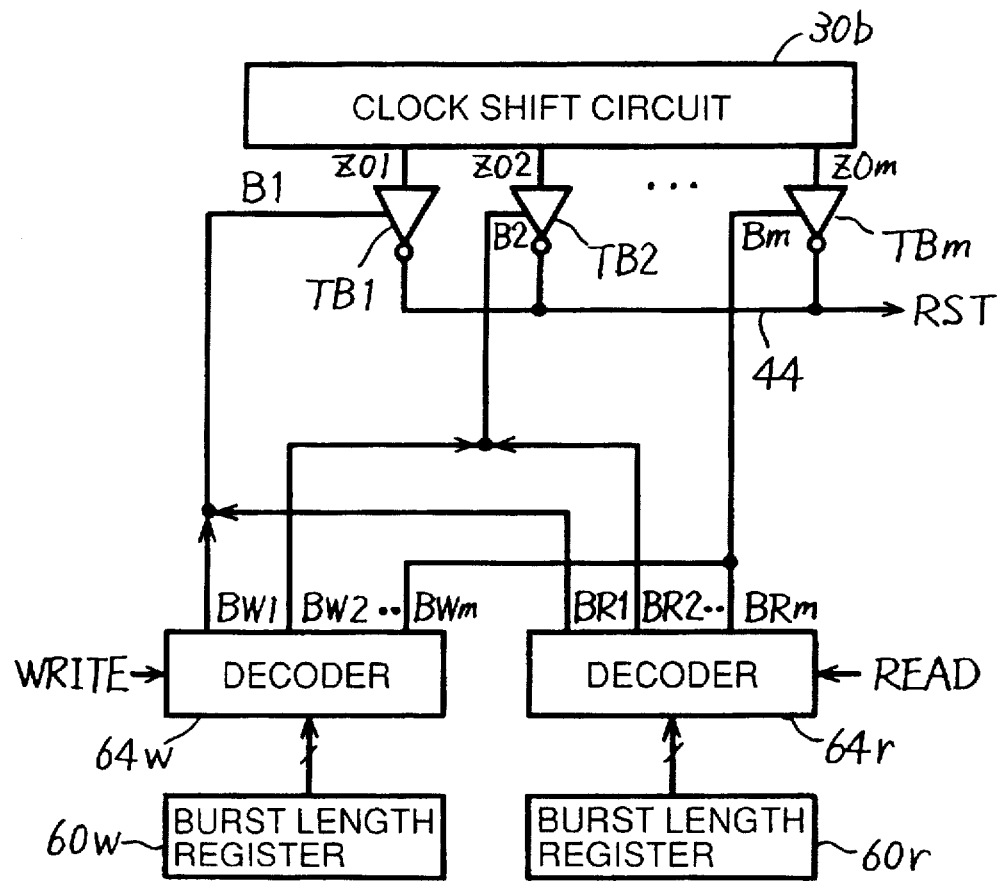
FIG. 9 shows a structure of a principal portion of a synchronous semiconductor memory device according to Embodiment 3 of the present invention.

FIG. 9 shows a structure of a principal portion of a synchronous semiconductor memory device according to Embodiment 3 of the present invention. In FIG. 9, the structure of the portion for setting the burst length of the burst length counter is illustrated.

Referring to FIG. 9, a burst length data generating portion includes a burst length register 60w for storing burst length data for data writing, a burst length register 60r for storing burst length data for data reading, a decoder 64w activated upon activation of internal write operation activation signal WRITE for decoding the burst length data stored in burst length register 60w to activate one of burst length selecting signals BW1 to BWm, and a decoder 64r activated upon activation of internal readout operation activation signal READ for decoding the stored data in burst length register 60r to put one of read burst length selecting signals BR1 to BRm in a selected state. Output signals BW1 to BWm of decoder 64w and output signals BR1 to BRm of decoder 64r are respectively wired-ORed to be burst length selecting signals B1 to Bm.

In the burst length counter, 3-state inverter buffers TB1 to TBm activated upon activation of burst length selecting signals B1 to Bm are provided for respective complementary burst length output nodes ZO1, ZO2, ... ZOm of clock shift circuit 30b. The output portions of these 3-state inverter buffers TB1 to TBm are commonly connected to signal line 44. Reset signal RST is output from signal line 44.

In the structure as described above, decoder 64w is activated when data writing operation is performed, so as to decode the data stored in burst length register 60w and put one of burst length selecting signals BW1 to BWm in a selected state. Decoder 64r is inactivated, and its output would be at an high impedance state. Thus, one of burst length selecting signals B1 to Bm is activated in accordance with the output signal of decoder 64w, and a corresponding 3-state inverter buffer (that is, either one of TB1 to TBm) is activated. As a result, when the number of clock shifts in clock shift circuit 30b is made equal to the burst length, reset signal RST on signal line 44 is activated to attain H level. Here, output signals ZO1 to ZOm of clock shift circuit 30b are inverted signals of output signals O1 to Om in Embodiment 2 described previously.

At the time of data read operation, readout operation activation signal READ is activated. Decoder 64r is activated to decode the burst length data stored in burst length register 60r, so as to activate one of burst length selecting signals BR1 to BRm. In decoder 64w, write operation activation signal WRITE is inactivated, and decoder 64w is set at an output high impedance state. Accordingly, in this state, one of 3-state inverter buffers TB1 to TBm is activated according to the output signal of decoder 64r, and an output signal of clock shift circuit 30b is selected, so that reset signal RST is generated.

In the structure shown in this FIG. 9, 3-state inverter buffers TB1 to TBm for selecting the burst length are employed upon both data writing and data reading such that number of components in the circuit structure can be reduced, thus reducing the area occupied.

In the above description of Embodiment 3, decoders 64w and 64r are set at output high impedance state when inactivated. It is not especially required that decoding circuits in decoders 64r and 64w are provided as 3-state buffers, if their output portions are provided with switching elements such as transmission gates.

In addition, if the data stored in burst length registers 60r and 60w are selected by activation signals READ and WRITE in the structure shown in FIG. 9, decoding of writing burst length data and reading burst length data at the time of data writing and data reading, respectively, can be performed with one single decoder, and accordingly, the number of decoders can be reduced.

Based upon the foregoing, in accordance with this Embodiment 3, the burst length data selecting portion is commonly employed upon data writing and for data reading so that number of components in the circuit structure can be reduced, and accordingly, the area occupied in the circuit (that is, the layout area) can be reduced.

Although the present invention has been described and illustrated in detail, it is clearly understood that the same is by way of illustration and example only and is to be taken by way of limitation, the spirit and scope of the present invention being limited only by the terms of the appended claims.

What is claimed is:

1. A synchronous semiconductor memory device operating in synchronization with an external clock signal applied periodically and repeatedly, comprising:

readout instruction signal generating means responsive to an externally applied readout instruction signal to generate an internal readout instruction signal in synchronization with said clock signal;

write instruction signal generating means responsive to an externally applied write instruction signal to generate an internal write instruction signal in synchronization with said clock signal;

read activation means responsive to said internal readout instruction signal for activating an internal readout operation activation signal;

write activation means responsive to said internal write instruction signal for activating an internal write operation activation signal; and resetting means coupled to receive both of said internal readout instruction signal and said internal write instruction signal to be activated in response to activation of one of said internal readout operation instruction signal and said internal write instruction signal, counting said clock signal to apply a reset signal to said read activation means and said write activation means so as to inactivate said read activation means and said write activation means when the value of a count of said clock signal reaches a predetermined value.

2. The synchronous semiconductor memory device according to claim 1, wherein said resetting means comprises a burst length counter for counting a burst length indicating the number of data which can be successively input or output in synchronization with said clock signal upon application of the readout instructing signal or the write instructing signal.

3. The synchronous semiconductor memory device according to claim 1, wherein said predetermined value is commonly determined for both of said internal read operation activation signal and said internal write operation activation signal.

4. The synchronous semiconductor memory device according to claim 1, wherein said resetting means includes:

write burst length setting means for setting a first predetermined value for said internal write operation activation signal and a read burst length setting means for setting a second predetermined value for said internal read operation activation signal; and means for validating said first predetermined value in responsive to activation of said internal write instruction signal and validating said second predetermined value in response to activation of said internal readout instruction signal.

5. The synchronous semiconductor memory device according to claim 4, wherein said resetting means includes:

a logic gate for obtaining a logical sum of said internal readout instruction signal and said internal write instruction signal;

a clock shift circuit for shifting an output signal from said logic gate in synchronization with said clock signal;

means for coupling an output node of said clock shift circuit corresponding to said first predetermined value to a reset output terminal in response to activation of said internal readout instruction signal; and means for coupling an output node of said clock shift circuit corresponding to said second predetermined value to said reset output terminal in response to activation of said internal readout instruction signal, said reset output terminal outputting a signal for resetting said internal readout operation activation signal and said internal write operation activation signal.

6. The synchronous semiconductor memory device according to claim 1, wherein said resetting means comprises, write burst data register for storing a write burst data of a first predetermined value, read burst data register for storing a read burst data of a second predetermined value, clock shifter having output nodes and transferring the read out instruction signal and the write instruction signal through said output nodes in synchronization with said clock signal, write decoder responsive to activation of said internal write operation activation signal for generating a write select signal indicating an output node among said output nodes in accordance with the data stored in said write burst data register, read decoder responsive to activation of said internal readout operation activation signal, for generating a read select signal indicating an output node among said output nodes in accordance with the data stored in said read burst data register, and selector responsive to the read select signal and write select signal for selecting an output node indicated among said output node to generate said reset signal.

7. The synchronous semiconductor memory device according to claim 1, wherein said read activation means comprises means responsive to said internal write instruction signal being active, for resetting the internal readout operation activation signal, and said write activation means comprises means responsive to said internal readout instruction signal being active, for resetting the internal write operation activation signal.

\* \* \* \* \*

UNITED STATES PATENT AND TRADEMARK OFFICE
CERTIFICATE OF CORRECTION

PATENT NO. : 5,893,925
DATED : April 13, 1999
INVENTOR(S) : Seiji Sawada

It is certified that error appears in the above-identified patent and that said Letters Patent is hereby corrected as shown below:

Title page, item [54] and col. 1, line 2, in the title, after "BURST" add-- LENGTH--

Title page, item [73] Assignee: add Mitsubishi Denki Kabushiki Kaisha, Tokyo, Japan--

Signed and Sealed this

Eleventh Day of January, 2000

Attest:

Q. TODD DICKINSON

Attesting Officer

Acting Commissioner of Patents and Trademarks